(12) United States Patent
Sturm et al.

(10) Patent No.: US 7,840,876 B2
(45) Date of Patent: Nov. 23, 2010

(54) POWER SAVINGS FOR MEMORY WITH ERROR CORRECTION MODE

(75) Inventors: Andre Sturm, Essex Junction, VT (US); Harald Streif, Burlington, VT (US)

(73) Assignee: Qimonda AG, München (DE)

( * ) Notice: Subject to any disclaimer, the term of this patent is extended or adjusted under 35 U.S.C. 154(b) by 947 days.

(21) Appl. No.: 11/676,774

(22) Filed: Feb. 20, 2007

(65) Prior Publication Data

US 2008/0201626 A1 Aug. 21, 2008

(51) Int. Cl.
*G11C 29/00* (2006.01)
(52) U.S. Cl. .................................. 714/766
(58) Field of Classification Search .......... 714/763–767
See application file for complete search history.

(56) References Cited

U.S. PATENT DOCUMENTS

| | | | |
|---|---|---|---|
| 4,688,219 A | 8/1987 | Takemae | |
| 4,730,320 A | 3/1988 | Hidaka et al. | |
| 4,912,710 A | 3/1990 | Rolfe | |
| 5,134,616 A | 7/1992 | Barth, Jr. et al. | |
| 5,307,356 A | 4/1994 | Fifield | |
| 5,313,425 A | 5/1994 | Lee et al. | |
| 5,546,410 A * | 8/1996 | Ando et al. | 714/764 |
| 5,784,391 A | 7/1998 | Konigsburg | |
| 5,961,660 A * | 10/1999 | Capps et al. | 714/763 |
| 6,543,029 B1 | 4/2003 | Sandorfi | |
| 6,697,992 B2 | 2/2004 | Ito et al. | |
| 6,754,858 B2 | 6/2004 | Borkenhagen et al. | |
| 6,792,567 B2 | 9/2004 | Laurent | |
| 6,851,081 B2 | 2/2005 | Yamamoto | |
| 7,096,407 B2 * | 8/2006 | Olarig | 714/768 |
| 7,353,438 B2 | 4/2008 | Leung et al. | |
| 7,467,337 B2 | 12/2008 | Nakamura et al. | |
| 2003/0115538 A1 | 6/2003 | Derner et al. | |
| 2003/0226090 A1 * | 12/2003 | Thayer | 714/763 |
| 2006/0059298 A1 | 3/2006 | Cho et al. | |

OTHER PUBLICATIONS

University of New Brunswick, "Error Correction and the Hamming Code, EE4253 Digital Communications," pp. 1-4 (Apr. 2, 2002), <http://www.ee.unb.ca/tervo/ee4253/hamming.htm>.

* cited by examiner

*Primary Examiner*—Shelly A Chase
(74) *Attorney, Agent, or Firm*—Coats & Bennett, P.L.L.C.

(57) ABSTRACT

The present invention includes a memory device with a data memory and an error correction code control circuit. The data memory stores data parity information for error correction. The error correction code control circuit is configured to receive a selection signal indicative of whether an error correction mode is to be used. Power to access the portion of the memory storing the parity information is disabled when the error correction mode is enabled.

21 Claims, 8 Drawing Sheets

POWER SAVINGS FOR MEMORY WITH ERROR CORRECTION MODE

BACKGROUND

Memory devices have memory arrays with large numbers of individual memory cells. During fabrication of the memory arrays, or in subsequent packaging of the memory, it is possible for cell failures to be introduced in the memory. Furthermore, errors can occur in processing data in and out if memory cells. In some cases, introduction of such failures can result in the need to discard the device entirely.

Consequently, many memory devices utilize error correction code (ECC) or an ECC mode to compensate for cell failures in memory arrays. The ECC mode is used to generate parity codes, which are stored in a parity memory, to detect, and in some cases correct, errors or failures in memory cells. In some cases, ECC circuitry is built onto a memory chip in order to achieve superior quality for a customer.

Typically, memory devices have a memory array within which specific areas are dedicated to store ECC parity bits. For some applications of these memory devices the ECC mode will be used and for others it will not. In applications where the ECC mode is not used, the area of the memory array dedicated to storing ECC parity bits unnecessarily draws and uses current. For these and other reasons, there is a need for the present invention.

SUMMARY

One aspect of the present invention provides a memory device with an error correction code control circuit. The memory stores data memory and parity information. The error correction code control circuit is configured to receive a selection signal indicating whether error correction mode is to be activated. Power to local wordlines of the parity memory array is disabled when the selection signal indicates that the error correction mode is not to be activated.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
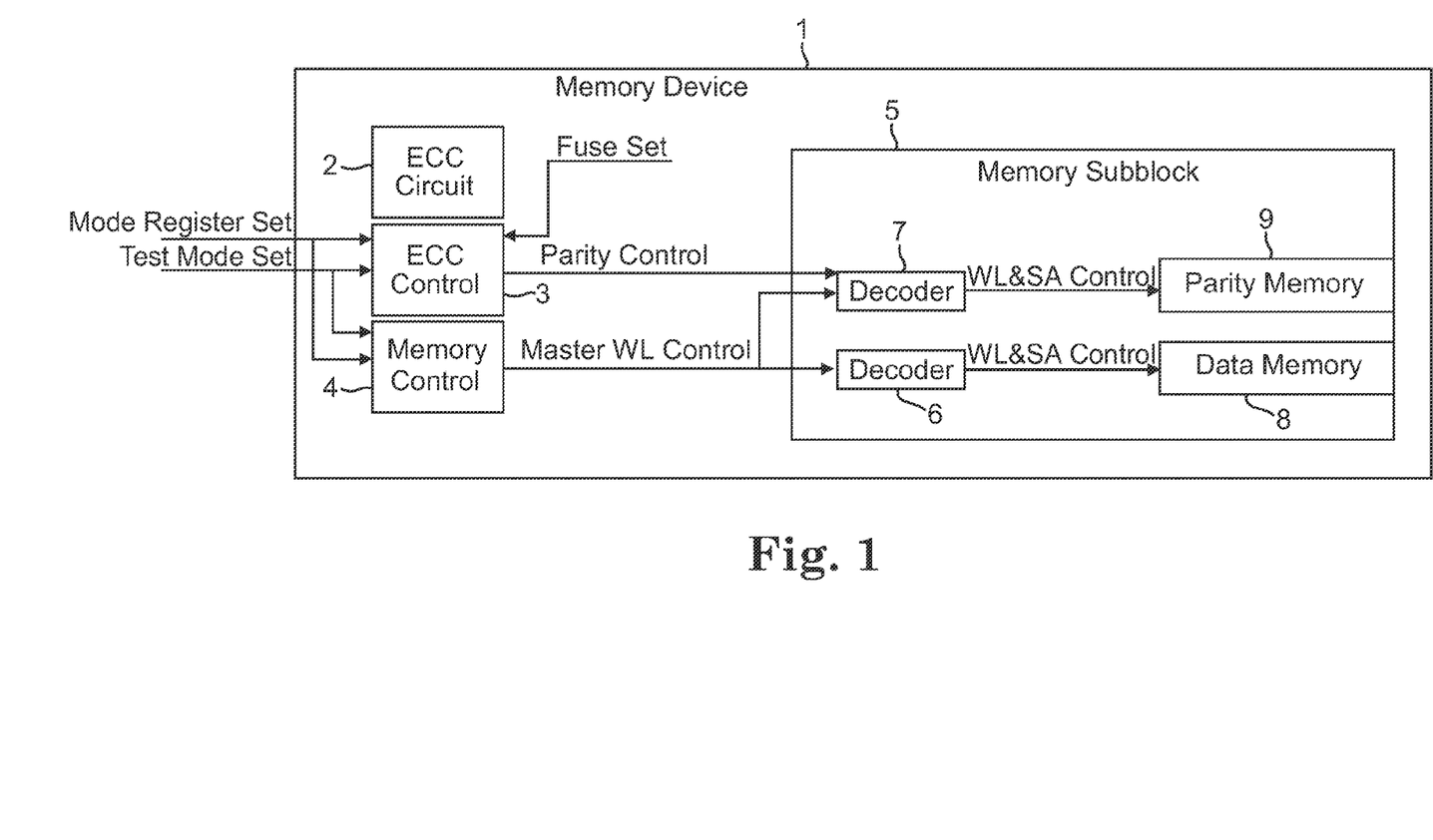
FIG. 1 illustrates a memory device in accordance with one embodiment of the present invention.

FIG. 1 illustrates memory device 1 in accordance with one embodiment of the present invention. In one embodiment, memory device 1 includes ECC circuit 2, ECC control 3, memory control 4, and memory sub-block 5. Memory sub-block 5 includes data memory 8 and parity memory 9. A first decoder 7 supplies access control signals to parity memory 9 and second decoder 6 supplies access control signals to data memory 8. Memory device 1 can be any of a variety of memory systems, such as dynamic random access memory (DRAM), synchronous random access memory (SRAM), double data rate (DDR) DRAM and SRAM, DDR II and others.

In fabrication and/or operation of such memory devices, it is possible for cell failures to be introduced in the memory sub-block 5. As such, one embodiment of memory device 1 provides an ECC mode that allows such failures to be detected and/or corrected. In one case, the memory system is configured with error correction code (ECC) circuit 2. As such, ECC circuit 2 is provided to compensate for cell failures in data memory 8. ECC circuit 2, in cooperation with ECC control 3 and memory control 4, generates parity codes that are used to detect and correct errors or failures in memory cells. The error correction codes or parity codes are stored in parity memory 9. As such, ECC circuit 2 is in communication with both parity memory 9 and data memory 8 (not all connections are shown for simplification of the illustration).

Because the ECC mode is not always used in memory device 1 for all applications of the device, however, one embodiment of the memory device 1 is configured such that ECC control circuit 3 alternately enables and disables the ECC mode. More specifically, ECC control 3 is configured to provide a parity control signal to first decoder 7, which in turn supplies access control signals to parity memory 9. In this way, the parity control signal from ECC control 3 enables and disables the parity memory 9 within memory sub-block 5. In one case, this control includes controlling wordline signals and sense amplifier signals in the parity memory 9.

Parity memory in a conventional memory system with an ECC mode uses operating current, whether or not the ECC mode is actually utilized. With ECC control circuit 3 and the parity control signal in accordance with one embodiment of the present invention, however, memory device 1 can disable first decoder 7 thereby disabling activation of parity memory 9 and hence saving power. Such disabling saves the operating current that would normally be expended by the parity memory 9, as will be explained in further detail below.

The determination or selection of whether the ECC mode will be used in any particular application can be provided to memory device 1 in a variety of ways consistent with the present invention. For example, ECC control 3 can be configured to receive signals indicative of whether the ECC mode is to be used in memory device 1. One such signal can be a Mode Register set signal from a pad that enables and disables the ECC mode as controlled via signals provided to the pad. In another instance, a Fuse set signal is provided via a fuse that can be blown or not blown in order to essentially "hardcode" the enabling or disabling of the ECC mode. Also, a Test Mode set signal can be provided to ECC control 3 such that test modes or other operational modes can be used to "softcode" the enabling or disabling of the ECC mode.

Figure 2:
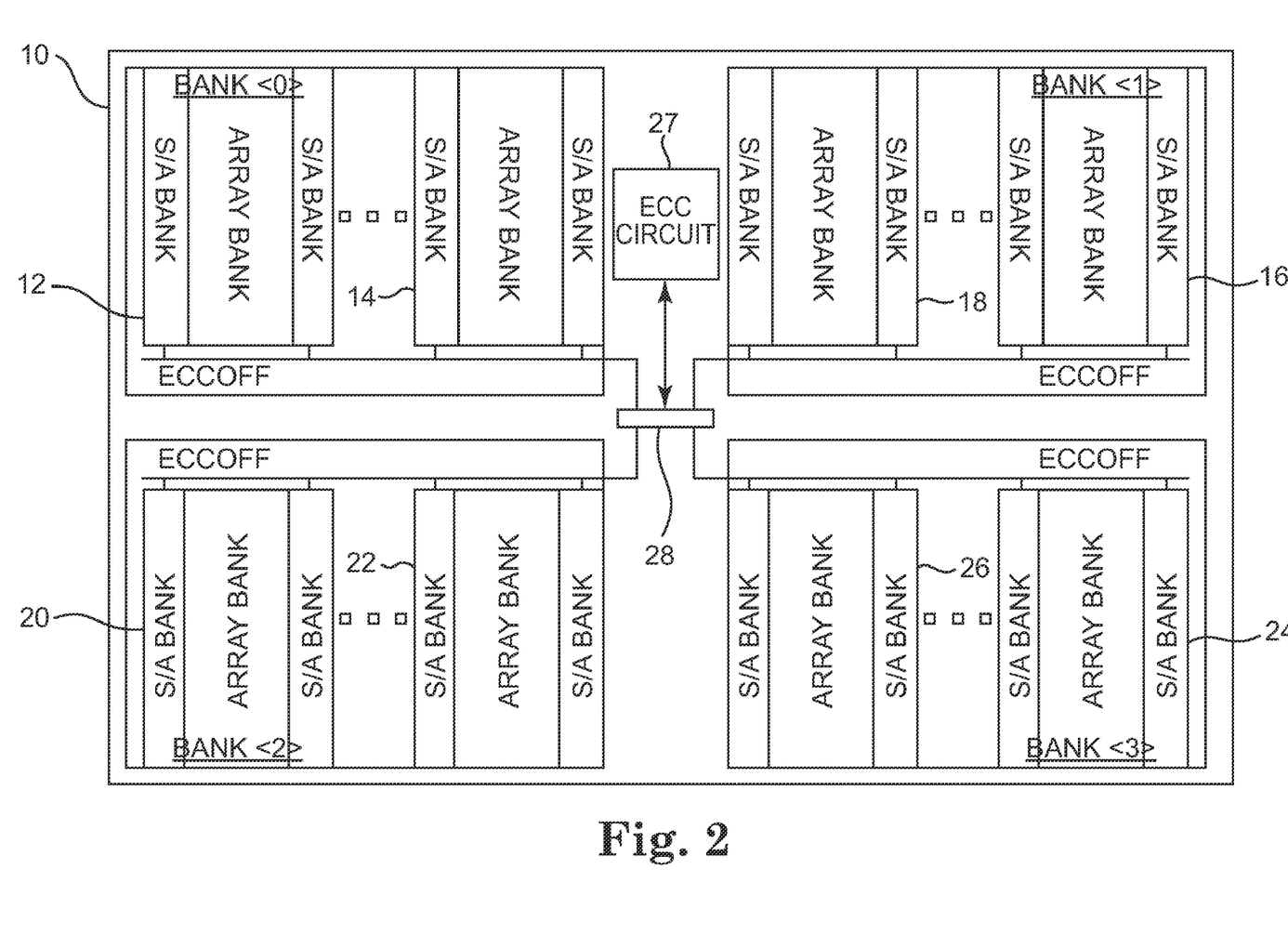
FIG. 2 illustrates a further embodiment of a memory device in accordance with one embodiment of the present invention.

FIG. 2 illustrates a memory device 10 in accordance with one embodiment of the present invention. In one embodiment, memory device 10 includes four memory banks: bank 0, bank 1, bank 2, and bank 3. In turn, each memory bank 0-3 includes a plurality of sub-blocks. For example, bank 0 is illustrated with a plurality of sub-blocks 12 through 14. Similarly, bank 1 includes sub-blocks 16 through 18, bank 2 includes sub-blocks 20 through 22, and bank 3 includes sub-blocks 24 through 26. For each, although two specific sub-blocks are illustrated, many additional sub-blocks are typically also provided. Furthermore, other embodiments may use more or less memory banks than the four illustrated in the example.

Each of sub-blocks 12-26 includes an array bank that is configured to store data. Also, in this embodiment, sense amplifier (S/A) banks are provided on either side of the array bank in each sub-block. The S/A banks are used in the operation of reading and/or writing data from and/or to the corresponding array bank. Access to the four memory banks is provided by a data path coupled between the memory banks and control circuits and data and control pads, via which data is accessed from bank 0, bank 1, bank 2, and/or bank 3. In one embodiment memory device 10 is a low power DRAM chip, such as a low power DDR or SDR SDRAM. Bank 0, bank 1, bank 2, and bank 3 are organized in a square or rectangular-shaped configuration on the semiconductor memory device 10. In some cases, more or less memory banks are provided on the chip in other physical configurations.

Furthermore, in one embodiment, memory device 10 is configured with error correction code (ECC) mode, and thus, includes ECC circuit 27 and ECC control circuit 28 built onto the device. In fabrication and/or operation of memory device 10, it is possible for cell failures to be introduced in the memory. As such, the ECC circuit 27 and ECC control circuit 28 provide an ECC mode, which compensates for cell failures in the memory arrays within the memory banks 0-3 of memory device 10. In operation, ECC circuit 27 generates parity codes that are used to detect and correct errors or failures in memory cells. The error correction codes or parity codes are stored in the parity memory array of memory device 10.

Because the ECC mode is not always used in memory device 10 for all applications of the device, one embodiment is configured in conjunction with ECC control circuit 28 to selectively disable the ECC mode. ECC control circuit 28 is configured to alternately enable and disable ECC mode in memory device 10, and specifically, is configured to enable and disable the parity memory portions within memory banks 0-3. Since the parity memory uses operating current in conventional memory, whether or not ECC mode is actually utilized, ECC control circuit 28 in accordance with one embodiment of the present invention allows memory device 10 to disable the parity memory portions when they are not being used. Such disabling saves the part of the operating current that would normally be expended by activating the wordlines, bitlines and sense amplifiers in the part of the array containing only the parity data. This power savings can be significant in many applications.

In one embodiment, ECC control circuit 28 is provided directly on memory device 10. In one example, it is part of the control logic that controls the read and/or write operation of the memory device 10. In one example, ECC control circuit 28 generates an ECCOFF signal that is then provided to the S/A banks of the various sub-blocks within the memory banks 0-3. In one case, the ECCOFF signal has an active state and an inactive state. When in the inactive state, the ECCOFF signal allows memory device 10 to essentially operate normally with the parity memory portions within memory banks 0-3 fully operational. As such, the ECC mode is enabled and parity bits can be generated, stored in, and read from the parity memory portions of the memory banks 0-3.

When the ECCOFF signal is in an active state, however, the ECCOFF signal essentially disables the activation of the wordlines, the sense amplifiers and the bitlines in the parity memory portions within memory banks 0-3 that are dedicated to ECC parity bits. As such, this eliminates the power consumption necessary to activate these lines and amplifiers. Consequently, not only is the ECC mode disabled, but the actual portions of the memory array dedicated to the ECC mode are disabled so that power is not being unnecessarily expended on these portions of memory.

The ECCOFF control signal from ECC control circuit 28 can be generated in a variety of ways consistent with the present invention. For example, memory device 10 may be a known good die (KGD) or it may be part of a larger package that is delivered to a customer already fully assembled. As such, accessibility may differ depending on the type of package. In some instances a pad will be provided that is coupled to ECC control circuit 28 such that enabling and disabling the ECC mode can be controlled via signals provided to the pad. In other instances, a fuse is provided that can be blown or not blown in order to essentially "hard-code" the enabling or disabling of the ECC mode. Also, test modes or other operational modes can be used to "soft-code" the enabling or disabling of the ECC mode. With these various options, customers and/or manufactures of memory device 10 can optionally select the operability of the ECC mode and use of associated parity memory array based on an intended application.

In one embodiment, the control signal generated by ECC control 3 and the ECCOFF signal generated by ECC control circuit 28 includes both control for wordline signals and control for sense amplifier signals, both in the parity memory sections. FIGS. 3-8, and corresponding discussion below, address the control of wordline signals in the parity memory sections. FIGS. 9-14, and corresponding discussion below, address the control of sense amplifier signals in the parity memory sections.

Figure 3:
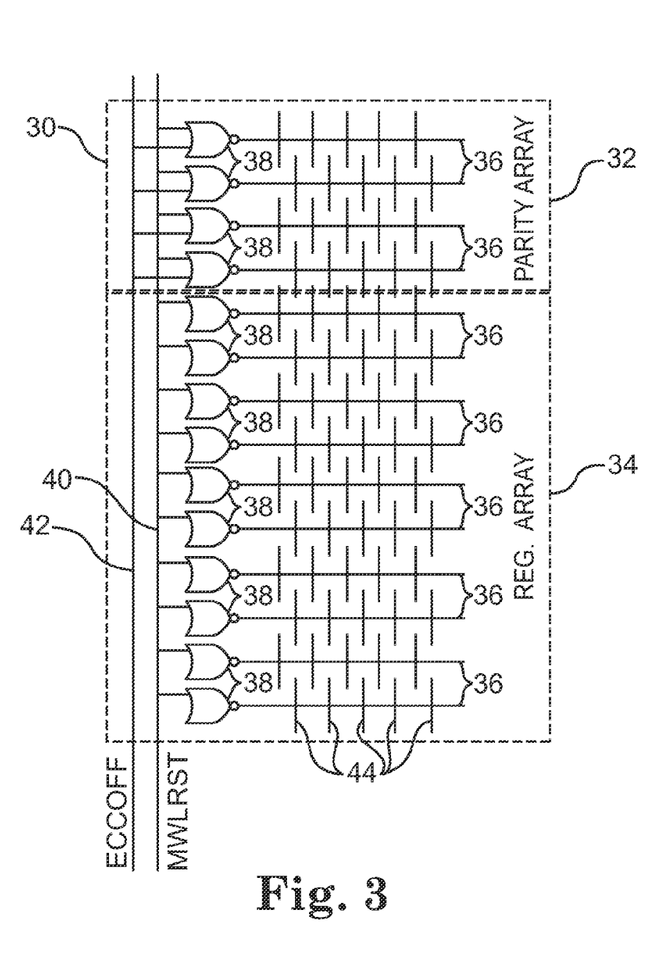
FIG. 3 illustrates a portion of the data memory device with a parity array control circuit in accordance with one embodiment of the present invention.
Figure 4:
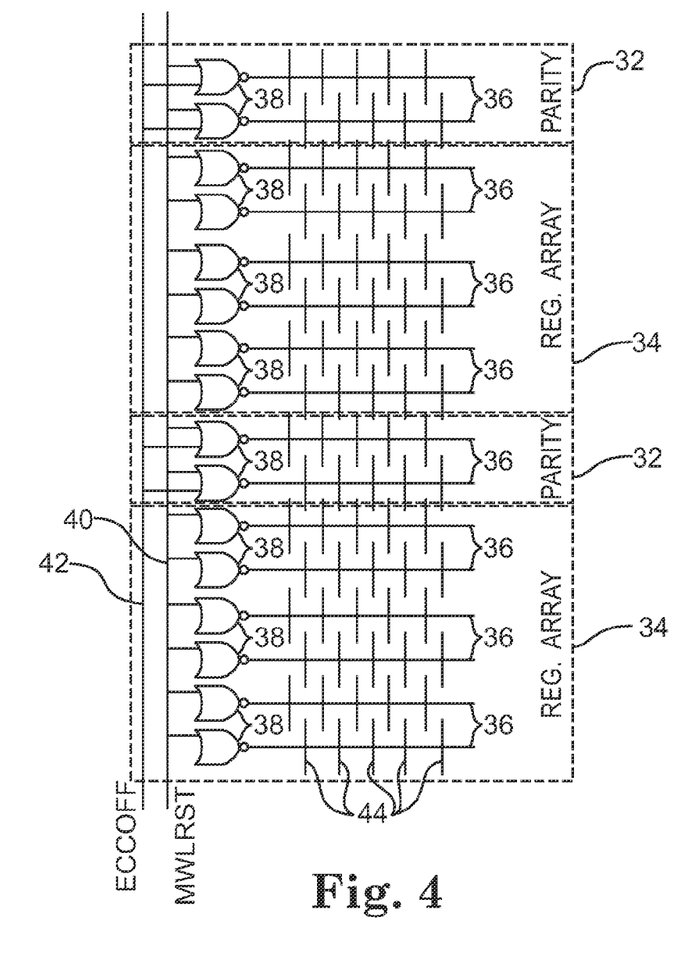
FIG. 4 illustrates a portion of the data memory device with a parity array control circuit in accordance with another embodiment of the present invention.

FIGS. 3 and 4 illustrate memory sub-block 30 of a memory device such as memory device 1 in FIG. 1 or memory device 10 in FIG. 2. For example, memory sub-block 30 may be a portion of any one of memory sub-blocks 12-26 of memory banks 0-3 in FIG. 2. In each case, memory sub-block 30 includes a regular memory array 34 and a parity memory array 32. In FIG. 3, a regular memory array 34 is oriented in a first single discrete location and a parity memory array 32 in second single discrete location adjacent the first location. In FIG. 4, both the regular memory array 34 and parity memory array 32 are divided into multiple locations and dispersed across memory sub-block 30.

In the examples of FIGS. 3 and 4, memory sub-block 30 is further divided into segments, such that a plurality of segmented wordline driver stripes 36 are provided. These stripes 36 are illustrated in FIGS. 3 and 4 as horizontally (relative to the orientation in the illustration of FIGS. 3 and 4) extending lines. Each of these wordline driver stripes 36 are further coupled to local word lines (LWL) 44. For ease of illustration, only the LWL 44 on one of the segmented wordline driver stripes 36 is actually labeled, but each of the illustrated segmented wordline driver stripes 36 is also coupled to a plurality of LWL 44, represented by short vertical (relative to the orientation in the illustration of FIGS. 3 and 4) extending lines.

In one embodiment, each of the plurality of segmented wordline driver stripes 36 is coupled to one of a plurality of NOR gate circuits 38. Some of the plurality of segmented wordline driver stripes 36 and correlating coupled NOR gate circuits 38 are provided in regular memory array 34 and some are provided in parity memory array 32. Each of the plurality of NOR gate circuits 38 receive a master wordline reset (MWLRST) signal over signal line 40, which is coupled to an input of each of NOR gate circuits 38. This MWLRST signal is used to generate a wordline reset (WLRST) signal and a wordline drive (WLDV) signal. These signals in turn are used to generate a plurality of local wordline (LWL) signals that drive a plurality of LWL 44.

Those NOR gate circuits 38 that are provided in parity memory array 32 also receive ECCOFF signal over signal line 42. In one example, the ECCOFF signal is generated by ECC control circuit 28 and coupled to an input of NOR gate circuits 38 in the parity memory array 32 via signal line 42. As such, when the ECCOFF signal is active, NOR gate circuits 38 disable segmented wordline driver stripes 36 that are provided in parity memory array 32. In this way, when the ECCOFF signal is active, the WLRST signal and WLDV signal are also held in essentially inactive states that cause the LWL signal to be inactive and remain in a low power state. Consequently, this prevents activation of the LWL 44 in the parity memory array 32 in the inactive case such that current is not consumed by LWL 44.

Such deactivation of LWL 44 in parity memory array 32 decreases the power consumption of memory device 10 in those instances when the ECC mode is not used. This power consumption savings is also enjoyed in active, standby and self-refresh modes of the device. Since memory device 10 does not simply disable ECC functionality when applicable, but also actually cuts off power to the local wordlines of the parity memory, this significant power savings is afforded.

The NOR gate circuits 38 that are provided in regular memory array 34 do not receive the ECCOFF signal. As such, these NOR gate circuits 38 are unaffected by the ECCOFF signal such that the segmented wordline driver stripes 36 in regular memory array 34 are not disabled. In this way, regardless of the activation or deactivation of the ECCOFF signal, the WLRST signal and WLDV signal are unaffected and in turn the LWL signal remains operating normally in regular memory array 34.

Figure 5:
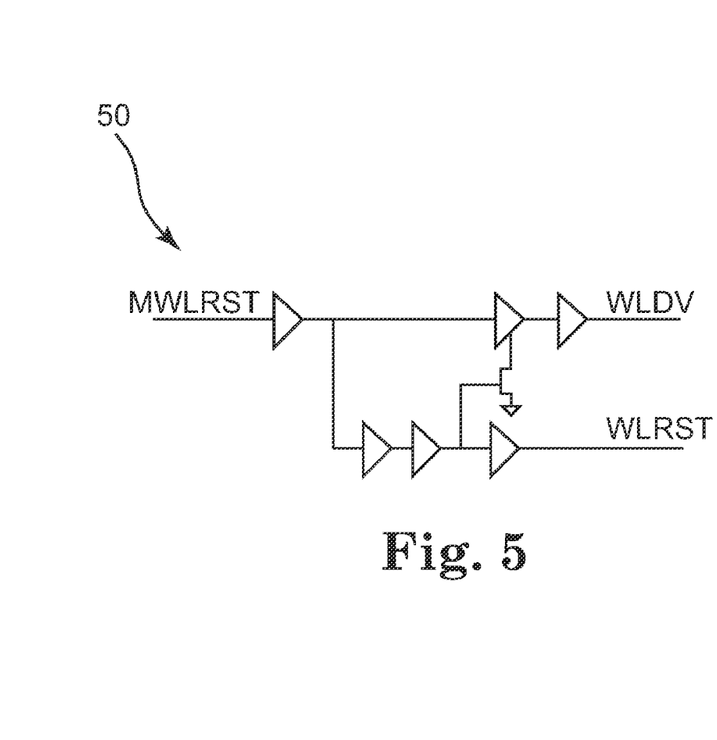
FIG. 5 illustrates a signal generation circuit in accordance with a known memory system.

FIG. 5 illustrates a conventional signal generation circuit 50. Signal generation circuit 50 is generally provided in the S/A banks of the various sub-blocks within the memory banks of a memory device and is configured to provide signals to the segmented wordline driver stripes. As illustrated, signal generation circuit 50 receives a master wordline reset (MWLRST) signal and generates a wordline reset (WLRST) signal and a wordline drive (WLDV) signal utilizing a plurality of inverters and transistors. These signals in turn generate a plurality local wordline (LWL) signals that drive a plurality of local wordlines.

Figure 6:
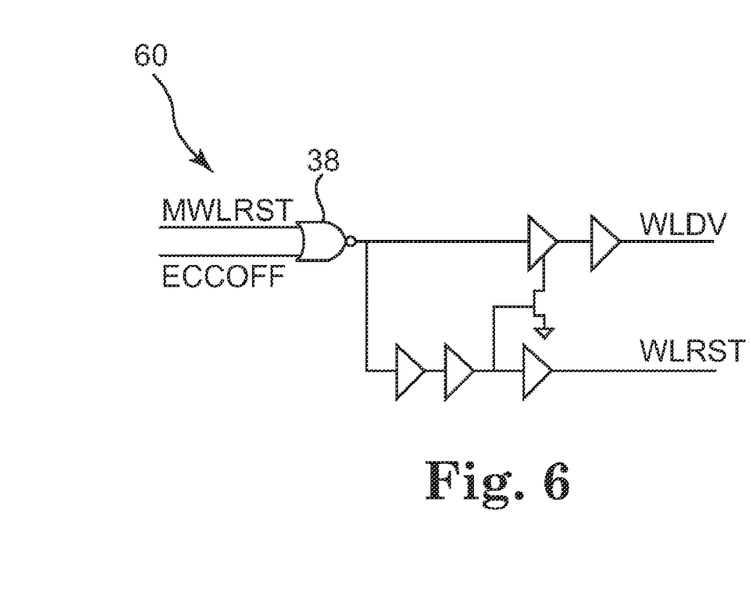
FIG. 6 illustrates a signal generation circuit in accordance with one embodiment of the present invention.

FIG. 6 illustrates signal generation circuit 60 in accordance in accordance with one embodiment of the present invention. Signal generation circuit 60 is provided in the S/A banks of sub-blocks 12-26 within the memory banks 0-3 of a memory device 10 and is configured to provide signals to the segmented wordline driver stripes 36. As illustrated, each signal generation circuit 60 is configured with a NOR circuit 38 that receives a master wordline reset (MWLRST) signal. This MWLRST signal generates a wordline reset (WLRST) signal and a wordline drive (WLDV) signal. These signals in turn generate a plurality of local wordline (LWL) signals that drive a plurality of LWL 44.

For each signal generation circuit 60 provided in parity memory array 32, each of the NOR gate circuits 38 also receive the ECCOFF signal. As such, when the ECCOFF signal is active, the NOR gate circuits 38 effectively disable segmented wordline driver stripes 36 that are provided in parity memory array 32 as discussed above, while those in the regular memory array 34 operate normally.

In the example of FIG. 6, NOR gate circuits 38 are illustrated. One skilled in the art will understand that a variety of different logic circuits may be employed to effectuate effectively enabling and disabling segmented wordline driver stripes 36 and hence enabling and disabling of LWL 44 in order to cut off power based on the output of ECC control circuit 28.

Figure 7:
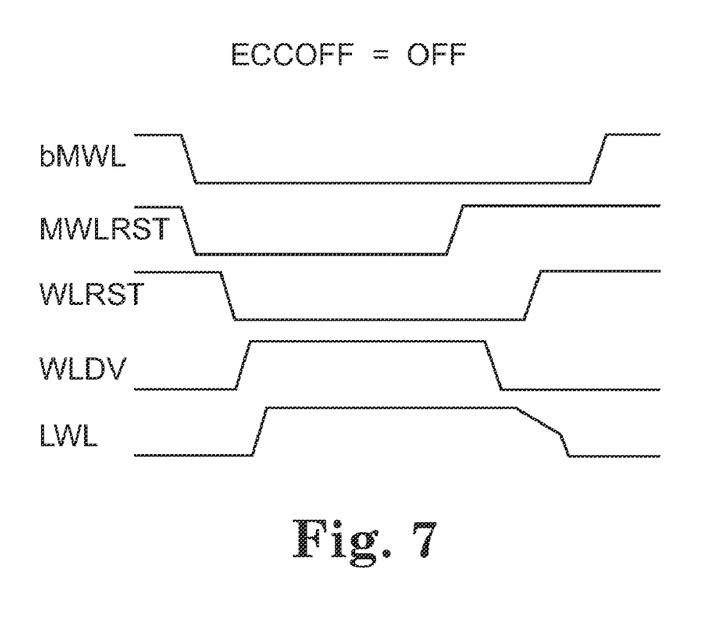
FIG. 7 illustrates a signal timing diagram for signals in a signal generation circuit for a memory system.
Figure 8:
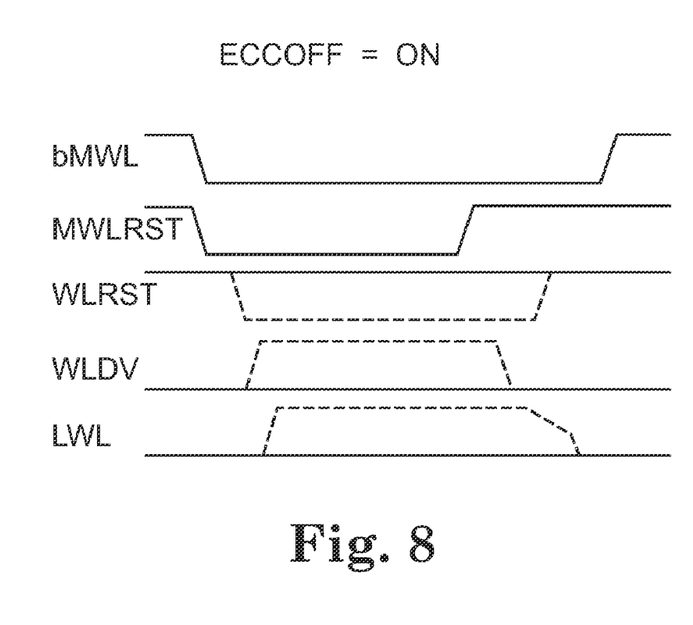
FIG. 8 illustrates a signal timing diagram for signals in a signal generation circuit for a memory system.

FIGS. 7 and 8 illustrate signal timing diagrams for memory device 10 in accordance with one embodiment of the present invention. FIG. 7 illustrates signals within memory device 10 for the condition when the ECCOFF signal is inactive and FIG. 8 illustrates signals within memory device 10 for the condition when the ECCOFF signal is active.

As is illustrated in FIG. 7, when the ECCOFF signal is inactive the signals in memory device 10 are in normal operation such that parity memory array 32 will be fully operational, just like that in regular memory array 34. In this case, the ECC mode is operating and has the capability to correct bit errors and utilize parity memory array 32 to store and retrieve parity bits.

As illustrated in FIG. 8, however, when the ECCOFF signal is active the signals in memory device 10 are affected such that parity memory array 32 will be turned off. Specifically, when the ECCOFF signal is active, the WLRST signal and WLDV signal are inactivated, thereby causing the LWL signal to be inactive and remain in a low power state. FIG. 8 illustrates the active versions of these signals under normal operation in dotted lines to show the contrast. The inactivity of these signals prevents activation of the LWL 44 in the parity memory array 32 in the ECCOFF signal active case, thereby creating power savings when the ECC mode is not in use.

As such, when a customer or manufacturer has determined that the ECC mode will not be used in some application, they can disable the ECC mode by affecting ECC control circuit 28 such that it produces the active state of the ECCOFF signal. The active ECCOFF signal cuts off the current to LWL 44 and gives added power savings in these circumstances.

Figure 9:
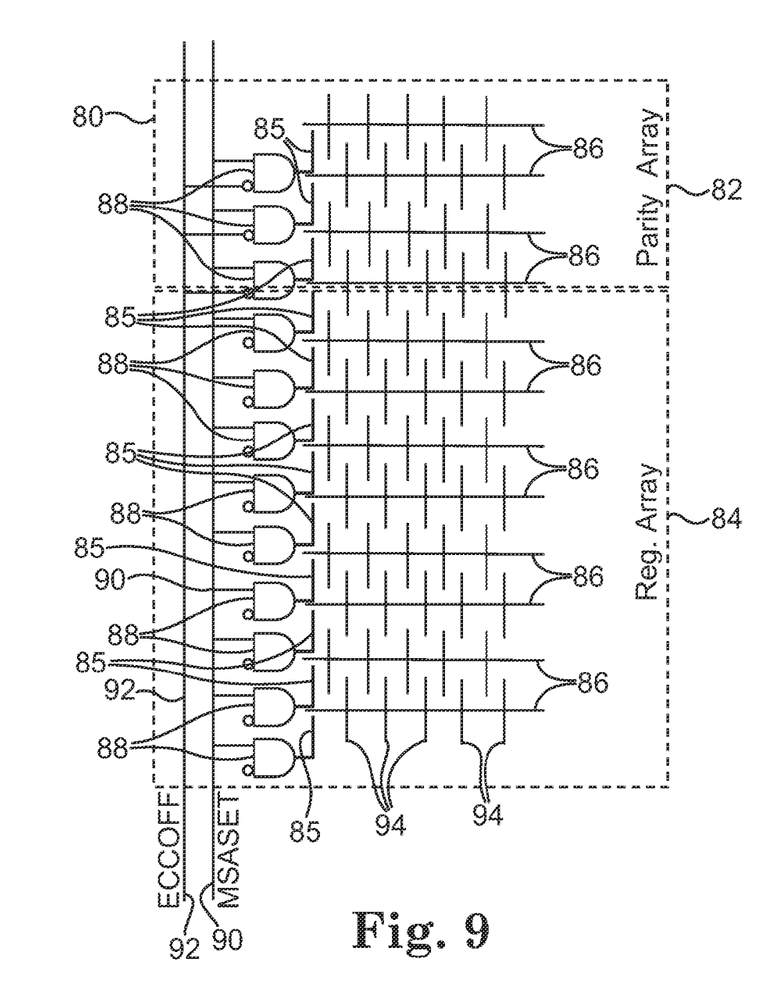
FIG. 9 illustrates a portion of the data memory device with a parity array control circuit in accordance with another embodiment of the present invention.

FIG. 9 illustrate memory sub-block 80 of a memory device such as memory device 1 in FIG. 1 or memory device 10 in FIG. 2. FIG. 9 is highly analogous to FIGS. 3 and 4 above. For ease of illustration, however, the NOR gate circuits 38 illustrated in FIGS. 3 and 4 are not shown in FIG. 9, and the AND gate circuits 88 illustrated in FIG. 9 are not shown in FIGS. 3 and 4.

In one example, memory sub-block 80 may be a portion of any one of memory sub-blocks 12-26 of memory banks 0-3 in FIG. 2. In each case, memory sub-block 80 includes a regular memory array 84 and a parity memory array 82. In FIG. 9, a regular memory array 84 is oriented in a first single discrete location and a parity memory array 82 in second single discrete location adjacent the first location. As with FIG. 4 above, however, both the regular memory array 84 and parity memory array 82 can be divided into multiple locations and dispersed across memory sub-block 80.

As with FIGS. 3 and 4, in the example of FIG. 9 memory sub-block 80 is further divided into segments, such that a plurality of segmented wordline driver stripes 86 are provided. These stripes 86 are illustrated in FIG. 9 as horizontally (relative to the orientation in the illustration of FIG. 9) extending lines. Each of these wordline driver stripes 86 are further coupled to local word lines (LWL) 94. For ease of illustration, only the LWL 94 on one of the segmented wordline driver stripes 86 is actually labeled, but each of the illustrated segmented wordline driver stripes 86 is also coupled to a plurality of LWL 94, represented by short vertical extending lines.

In one embodiment, each of the plurality of segmented wordline driver stripes 86 is coupled to one of a plurality of NOR gate circuits 38 (not illustrated in FIG. 9, but as was described above with respect to FIGS. 3 and 4). Furthermore, a plurality of sense amplifier segments 85 are provided, and each of the plurality of sense amplifier segments 85 is coupled to one of a plurality of AND gate circuits 88, as illustrated in FIG. 9. Some of the plurality of sense amplifier segments 85 and correlating coupled AND gate circuits 88 are provided in regular memory array 84 and some are provided in parity memory array 82.

Each of the plurality of AND gate circuits 88 receive a master sense amplifier set (MSASET) signal over signal line 90, which is coupled to input of each of AND gate circuits 88. This MSASET signal is used to generate a PSET signal for the P-sense amplifiers and a NSET signal for the N-sense amplifiers. These signals in turn are used to drive the P and N-sense amplifiers.

Those AND gate circuits 88 that are provided in parity memory array 82 also receive ECCOFF signal over signal line 92 and via an inverter at an input gate. As such, when the ECCOFF signal is active, AND gate circuits 88 disable sense amplifier segments 85 and bitlines that are provided in parity memory array 82. In this way, when the ECCOFF signal is active, the NSET signal and PSET signal are also held in essentially inactive states causing the sense amplifies to be inactive, such that the sense amplifier nodes are prevented from changing from their equalized state. This saves power that would otherwise be consumed by the sense amplifiers in the parity memory 82.

Such deactivation of the sense amplifiers in parity memory array 82 decreases the power consumption of memory device 10 in those instances when the ECC mode is not used. This power consumption savings is also enjoyed in active, standby and self-refresh modes of the device. Since memory device 10 does not simply disable ECC functionality when applicable, but also actually cuts off power to the sense amplifier segments 85 of the parity memory, thus significant power savings is afforded.

The AND gate circuits 88 that are provided in regular memory array 34 do not receive the ECCOFF signal. As such, these AND gate circuits 88 are unaffected by the ECCOFF signal such that the sense amplifier segments 85 in regular memory array 34 are not disabled. In this way, regardless of the activation or deactivation of the ECCOFF signal, the NSET signal and PSET signal are unaffected and in turn the bitline signal remains operating normally in regular memory array 84.

Figure 10A:
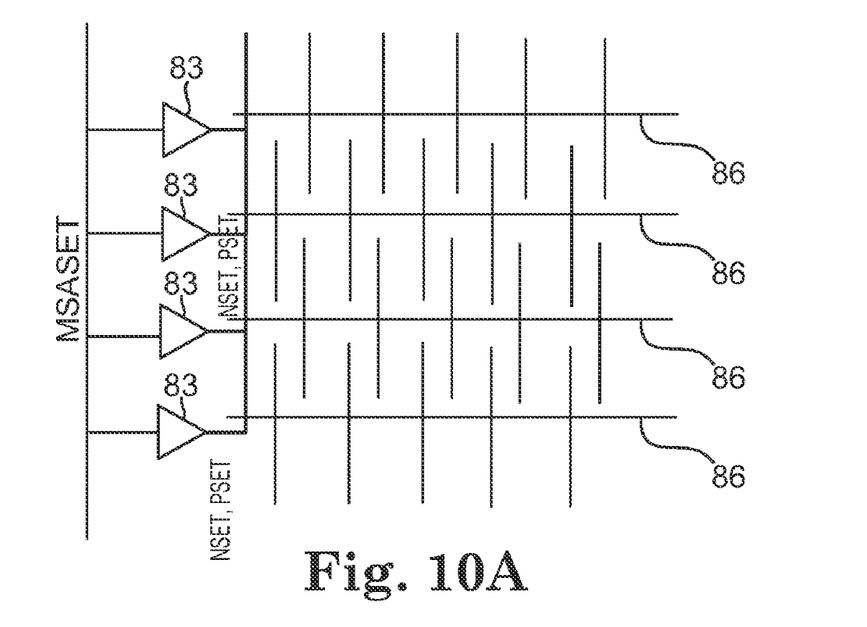
FIG. 10A illustrates a portion of a data memory device.

FIG. 10A illustrates a portion of a memory sub-block of a known memory device. In a typical memory sub-block of a known memory device, a master sense amplifier set (MSASET) signal is provided to a plurality of buffers. These buffers are then coupled to a sense amplifier stripe, which typically runs across several buffers along a portion of a memory sub-block and provides a PSET signal for the P-sense amplifiers and a NSET signal for the N-sense amplifiers. These signals in turn are used to drive the P and N-sense amplifiers.

Figure 10B:
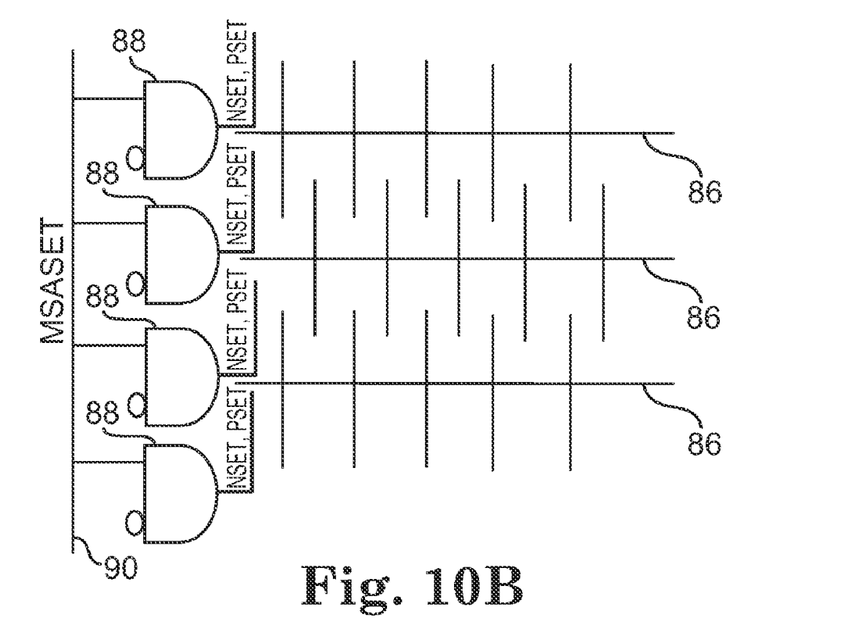
FIG. 10B illustrates a portion of a data memory device in accordance with another embodiment of the present invention.

FIG. 10B illustrates a portion of memory sub-block 80 such as that illustrated in FIG. 9 in accordance with one embodiment of the present invention. Here, a master sense amplifier set (MSASET) signal is provided via line 90 to a plurality of AND gates 88. Each of these AND gates 88 are then coupled to a sense amplifier segment 85. Unlike the portion of the memory sub-block illustrated in FIG. 10A, the sense amplifier segments 85 do not run across a plurality of gates. Rather, each sense amplifier segment 85 is coupled to one AND gate 88. The MSASET signal received by each AND gate 88 is used to generate a PSET signal for the P-sense amplifiers and a NSET signal for the N-sense amplifiers on each sense amplifier segment 85. These signals in turn are used to drive the P and N-sense amplifiers.

Figure 11:
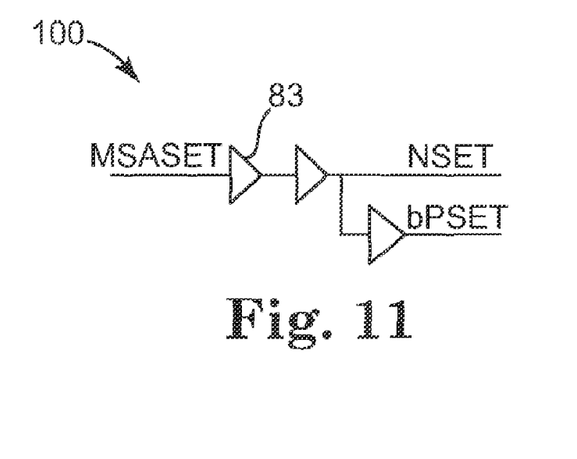
FIG. 11 illustrates a signal generation circuit in accordance with a known memory system.

FIG. 11 illustrates a conventional signal generation circuit 100. Signal generation circuit 100 is generally provided in the S/A banks of the various sub-blocks within the memory banks of a memory device and is configured to provide signals to the sense amplifier stripe (as illustrated in FIG. 10A). As illustrated, signal generation circuit 100 receives a master sense amplifier set (MSASET) signal and generates a NSET signal and a PSET signal utilizing a plurality of inverters.

Figure 12:
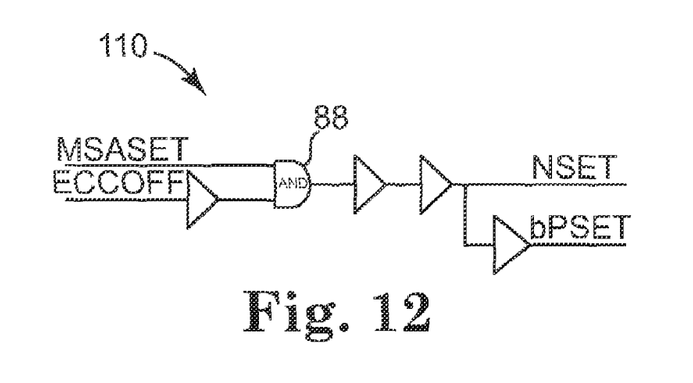
FIG. 12 illustrates a signal generation circuit in accordance with one embodiment of the present invention.

FIG. 12 illustrates signal generation circuit 110 in accordance with one embodiment of the present invention. Signal generation circuit 110 is provided in the S/A banks of sub-blocks 12-26 within the memory banks 0-3 of a memory device 10 and is configured to provide signals to the segmented sense amplifier segments 85 (as illustrated in FIG. 10B). As illustrated, each signal generation circuit 110 is configured with a AND gate circuit 88 that receives a master sense amplifier set (MSASET) signal. This MSASET signal generates a NSET signal and a PSET signal. These signals in turn drive the respective N and P-sense amplifiers.

For each signal generation circuit 110 provided in parity memory array 82, each of the AND gate circuits 88 also receive the ECCOFF signal. As such, when the ECCOFF signal is active, the AND gate circuits 88 effectively disable segmented sense amplifier segments 85 that are provided in parity memory array 82 as discussed above, while those in the regular memory array 84 operate normally.

In the example of FIG. 12, AND gate circuits 88 are illustrated. One skilled in the art will understand that a variety of different logic circuits may be employed to effectuate effectively enabling and disabling sense amplifier segments 85 and hence enabling and disabling of the sense amplifiers based on the output of ECC control circuit 28.

Figure 13:
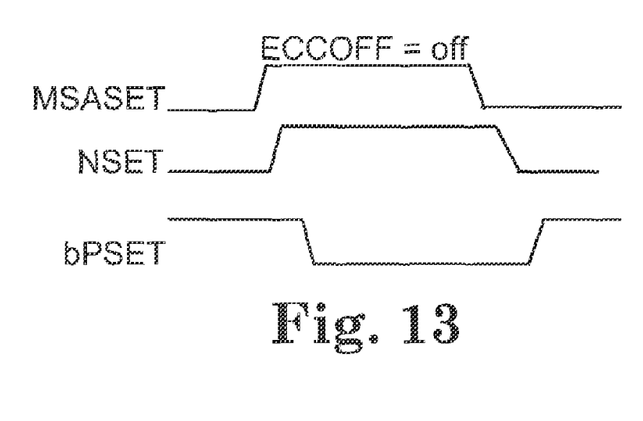
FIG. 13 illustrates a signal timing diagram for signals in a signal generation circuit for a memory system.
Figure 14:
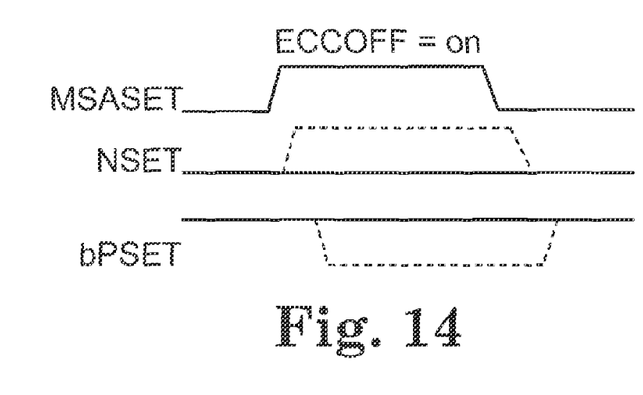
FIG. 14 illustrates a signal timing diagram for signals in a signal generation circuit for a memory system.

FIGS. 13 and 14 illustrate signal timing diagrams for memory device 10 in accordance with one embodiment of the present invention. FIG. 13 illustrates signals within memory device 10 for the condition when the ECCOFF signal is inactive and FIG. 14 illustrates signals within memory device 10 for the condition when the ECCOFF signal is active.

As is illustrated in FIG. 13, when the ECCOFF signal is inactive the signals in memory device 10 are in normal operation such that parity memory array 82 will be fully operational, just like that in regular memory array 84. In this case, the ECC mode is operating and has the capability to correct bit errors and utilize parity memory array 82 to store and retrieve parity bits.

As illustrated in FIG. 14, however, when the ECCOFF signal is active the signals in memory device 10 are affected such that parity memory array 82 will be turned off. Specifically, when the ECCOFF signal is active, the NSET and PSET signals are inactivated, thereby causing the sense amplifiers to be inactive. FIG. 14 illustrates the active versions of these signals under normal operation in dotted lines to show the contrast. The inactivity of these signals prevents activation of the sense amplifiers in the parity memory array 82 in the ECCOFF signal active case, thereby creating power savings when the ECC mode is not in use.

As such, when a customer or manufacturer has determined that the ECC mode will not be used in some application, they can disable the ECC mode by affecting ECC control circuit 28 such that it produces the active state of the ECCOFF signal. The active ECCOFF signal cuts off the sense amplifiers and gives added power savings in these circumstances.

Although specific embodiments have been illustrated and described herein, it will be appreciated by those of ordinary skill in the art that a variety of alternate and/or equivalent implementations may be substituted for the specific embodiments shown and described without departing from the scope of the present invention. Thus, this application is intended to cover any adaptations or variations of the specific embodiments discussed herein. Therefore, it is intended that this invention be limited only by the claims and the equivalents thereof.

What is claimed is:

1. A memory comprising:
a first portion for storing data;
a second portion for storing parity information;
an error correction code control circuit configured to receive a selection signal indicative of whether an error correction mode is to be used and to disable power supply necessary to access the second portion of the memory when the selection signal indicates that the error correction mode is not enabled.

2. The memory of claim 1, wherein the error correction code control circuit produces an error correction code off signal that is active when the error correction mode is not to be used and that is inactive when the error correction mode is to be used.

3. The memory of claim 2, further comprising logic circuits configured to receive the error correction code off signal.

4. The memory of claim 3, wherein the logic circuits are configured to keep a wordline reset signal high and a wordline drive signal low in a segmented wordline driver stripe such that the local wordlines remain inactive.

5. The memory of claim 3, wherein the logic circuits are configured to disabling sense amplifier segments such that sense amplifiers and bitlines remain inactive.

6. A semiconductor memory device comprising:
a plurality of memory banks;
a plurality of memory sub-blocks within each of the plurality of memory banks;
regular memory arrays and parity memory arrays within the plurality of memory sub-blocks of the memory banks; and
a error correction code control circuit configured to generate a error correction code output signal having a first and a second state, the error correction code output signal being received by the plurality of memory sub-blocks;
wherein the parity memory arrays within the plurality of memory sub-blocks are alternatively enabled and disabled in response to the state of the error correction code output signal.

7. The semiconductor memory system of claim 6, wherein the error correction code control circuit is in communication with a control pad such that the state of the error correction code output signal may be selected via the control pad.

8. The semiconductor memory system of claim 6, wherein the error correction code control circuit is in communication with a fuse such that the state of the error correction code output signal may be selected via manipulation of the fuse.

9. The semiconductor memory system of claim 6, wherein the error correction code control circuit is in communication with test modes such that the state of the error correction code output signal may be selected via the operation of the test modes.

10. A memory device comprising:
a data memory configured with error correction code capability;
selection means by which the error correction code is alternately enabled and disabled; and
parity memory that is cut off from power when the error correction code is disabled.

11. The memory device of claim 10 further comprising a segmented wordline driver stripe in the parity memory, wherein the disabling of the error correction code causes control signals in the segmented wordline driver stripe for the local wordlines and the local wordlines in the parity memory array itself to become inactive and not draw power.

12. The memory device of claim 10, wherein the control signals in the segmented wordline driver stripe for the local wordlines and the local wordlines in the parity memory array itself are inactive when the error correction code is disabled during one or more of an active mode, a standby mode and a self-refresh operation of the memory device.

13. The memory device of claim 10, further comprising a sense amplifier segment in the parity memory, wherein the disabling of the error correction code causes control signals in the sense amplifier segment to disable the sense amplifiers in the parity memory and not draw power.

14. A method for controlling a memory device configured with error correction code, the method comprising:
reading and/or writing data from/into the memory device;
sending an indication to the memory device of whether error correction code is to be used; and
alternatively enable and disable sections of the memory device dedicated to error correction code in response to the indication of whether error correction code is to be used.

15. The method of claim 14, wherein sending an indication to the memory device of whether error correction code is to be used further comprises sending the indication to an error correction code control circuit that is configured to generate a error correction code output signal having a first state indicating that the error correction code should be disabled and a second state indicating that the error correction code should be enabled.

16. The method of claim 15, wherein the error correction code output signal is provided to a signal generation circuit that disables local wordlines of parity memory arrays when the error correction code output signal is in the first state.

17. The method of claim 15, wherein the error correction code output signal is provided to a signal generation circuit that disables local bitlines and sense amplifiers of parity memory arrays when the error correction code output signal is in the first state.

18. The method of claim 15, wherein the error correction code output signal is provided to a signal generation circuit that enables sense amplifier segment in the parity memory and local wordlines of parity memory arrays when the error correction code output signal is in the second state.

19. A method of controlling a semiconductor memory system with error correction code, the method comprising:

providing a plurality of memory banks;
providing a plurality of memory sub-blocks within each of the plurality of memory banks;
generating a error correction code output signal in an error correction code control circuit, the error correction code output signal alternatively indicating that the error correction code should be enabled and disabled; and
providing the error correction code output signal to a parity memory array within the plurality of memory sub-blocks of the memory banks such that the parity memory array is enabled and disabled in accordance with the error correction code output signal.

20. The method of claim 19, wherein the error correction code output signal is provided to a signal generation circuit that alternately enables and disables local wordlines of the parity memory arrays in accordance with the error correction code output signal.

21. The method of claim 20, wherein the error correction code control circuit is in communication with one of a group comprising a control pad, a fuse and test modes, such that the state of the error correction code output signal may be selected via one of the control pad, the fuse and the test modes.

* * * * *